(12) United States Patent
Hata et al.

(10) Patent No.: US 8,076,677 B2
(45) Date of Patent: Dec. 13, 2011

(54) SEMICONDUCTOR LIGHT EMITTING DEVICE

(75) Inventors: Yasunori Hata, Kyoto (JP); Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/962,150

(22) Filed: Dec. 7, 2010

(65) Prior Publication Data

US 2011/0073895 A1    Mar. 31, 2011

Related U.S. Application Data

(63) Continuation of application No. 12/080,966, filed on Apr. 8, 2008, now Pat. No. 7,868,334.

(30) Foreign Application Priority Data

Apr. 9, 2007   (JP) ................. 2007-101564

(51) Int. Cl.
   *H01L 27/15*   (2006.01)
(52) U.S. Cl. .............. 257/79; 257/13; 257/77; 257/78; 257/99; 257/103; 257/E29.069; 257/E21.108; 257/E33.031; 257/E33.056; 257/E33.058
(58) Field of Classification Search .............. 257/77, 257/78, 99, 103, E33.032, E33.056, E33.058, 257/E29.089, E21.108, 13, 79
See application file for complete search history.

(56) References Cited

U.S. PATENT DOCUMENTS

| | | | |
|---|---|---|---|
| 6,943,433 B2 | 9/2005 | Kamada | |
| 7,619,260 B2 * | 11/2009 | Takekuma | ............ 257/99 |
| 2004/0046242 A1 | 3/2004 | Asakawa | |
| 2006/0033117 A1 | 2/2006 | Takekuma | |
| 2006/0220052 A1 | 10/2006 | Kamiya et al. | |
| 2007/0029563 A1 | 2/2007 | Amano et al. | |
| 2007/0187706 A1 * | 8/2007 | Higashi et al. | ............ 257/98 |
| 2008/0173878 A1 | 7/2008 | Waitl et al. | |
| 2009/0315049 A1 | 12/2009 | Urasaki et al. | |

FOREIGN PATENT DOCUMENTS

JP    2003-188418    7/2003

* cited by examiner

*Primary Examiner* — Long K Tran
(74) *Attorney, Agent, or Firm* — Hamre, Schumann, Mueller & Larson, P.C.

(57) ABSTRACT

A semiconductor light emitting device includes a semiconductor light emitting element, a lead electrically connected to the semiconductor light emitting element, and a resin package covering the semiconductor light emitting element and part of the lead. The resin package includes a lens facing the semiconductor light emitting element. The lead includes an exposed portion that is not covered by the resin package. The exposed portion includes a first portion and a second portion, where the first portion has a first mount surface oriented backward along the optical axis of the lens, and the second portion has a second mount surface oriented perpendicularly to the optical axis of the lens.

21 Claims, 8 Drawing Sheets

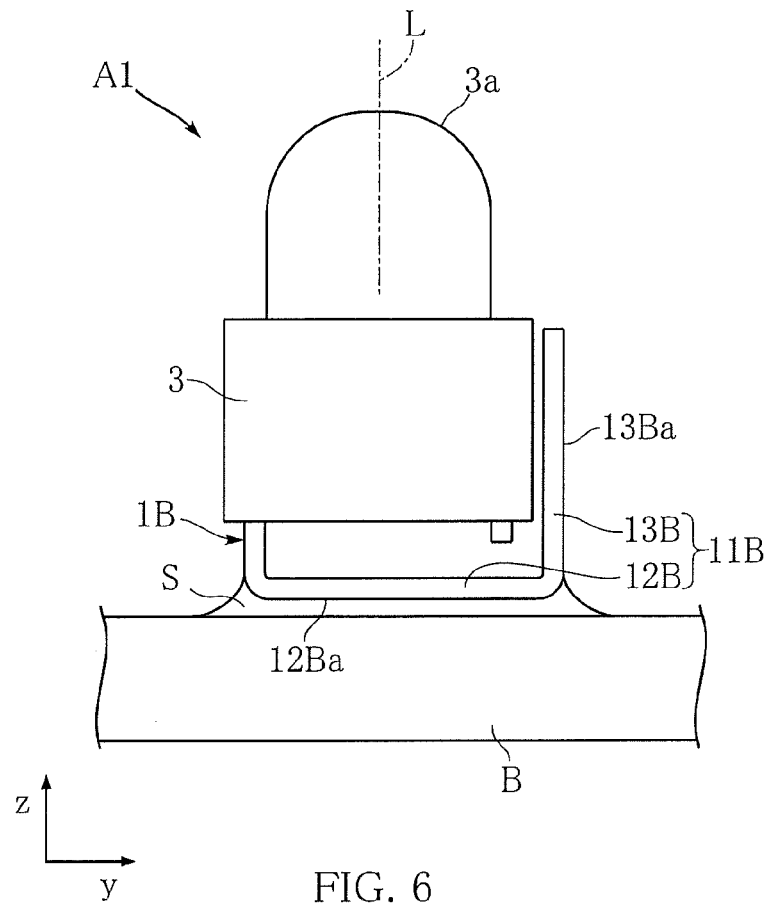
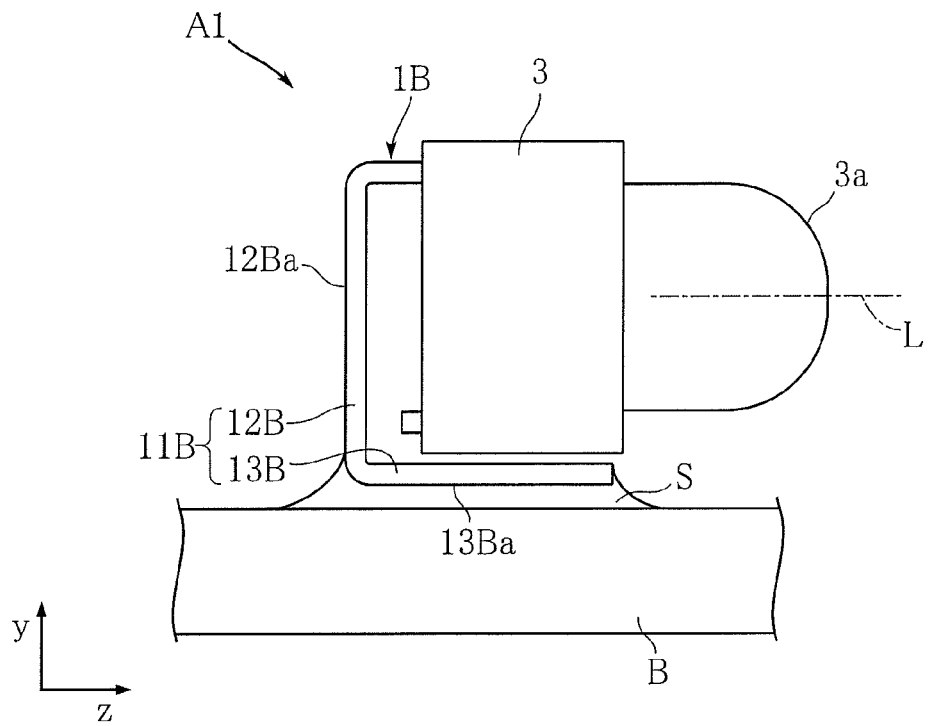

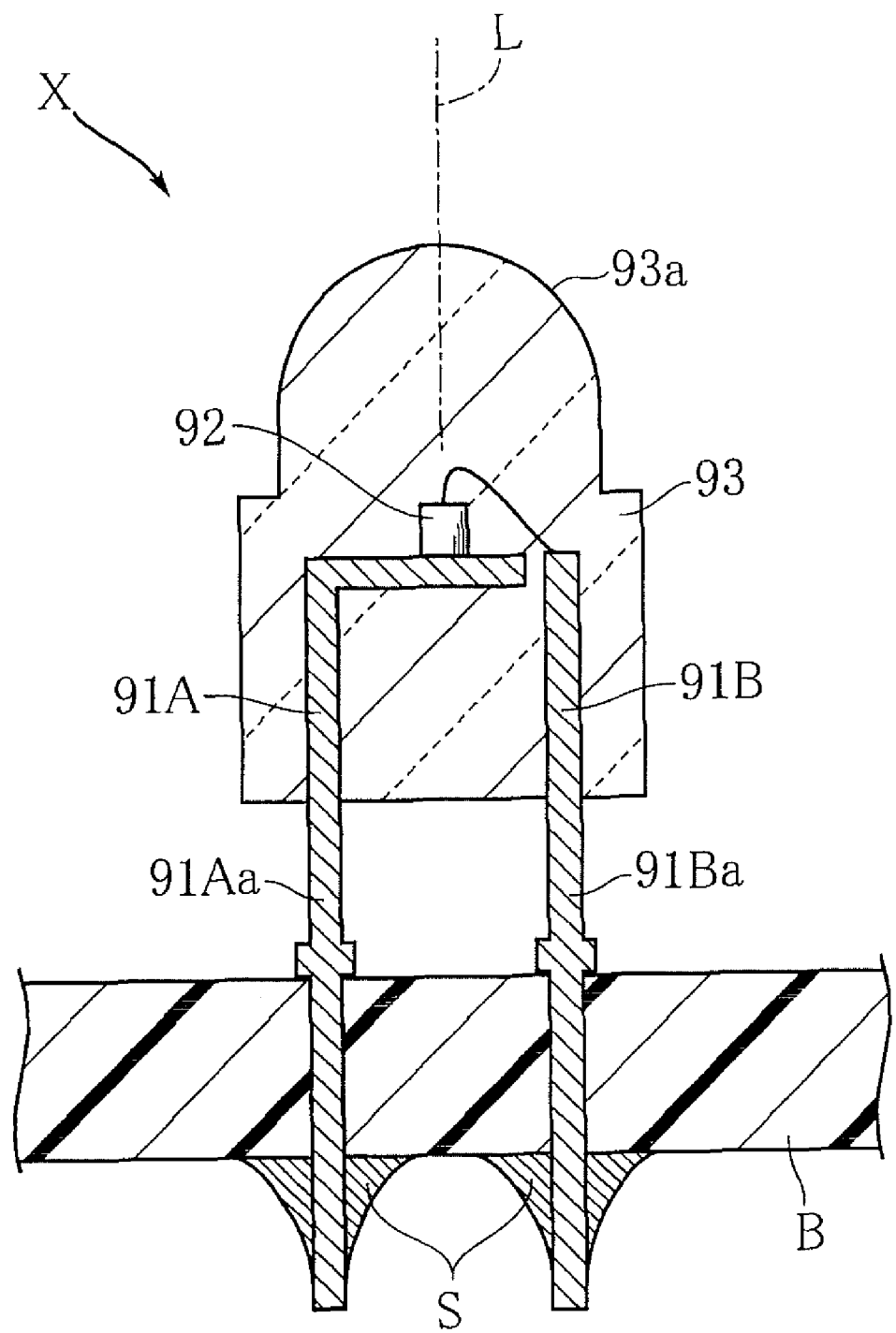

SEMICONDUCTOR LIGHT EMITTING DEVICE

CROSS REFERENCE TO RELATED APPLICATIONS

This application is a Continuation of U.S. Ser. No. 12/080,966 filed Apr. 8, 2008, now U.S. Pat. No. 7,868,334, which application is incorporated herein by reference.

BACKGROUND OF THE INVENTION

1. Field of the Invention

The present invention relates to a semiconductor light emitting device incorporating a semiconductor light emitting element.

2. Description of the Related Art

FIG. 14 shows an example of conventional semiconductor light emitting device (see JP-A-2003-188418, for example). The semiconductor light emitting device X shown in the figure includes a first lead 91A, a second lead 91B, an LED chip 92 and a resin package 93. The LED chip 92 is mounted on the first lead 91A. The LED chip 92 is connected to the second lead 91B via a wire. The resin package 93 covers the LED chip 92 and part of each lead 91A, 91B. The resin package 93 is formed with a lens 93a. The portions of the leads 91A and 91B which project from the resin package 93 provide terminals 91Aa and 91Ba, respectively. The semiconductor light emitting device X is fixed to a substrate B using solder S, with the terminals 91Aa and 91Ba inserted in the substrate B. Thus, the semiconductor light emitting device X is used as a top view type light source for emitting light in the direction (normal direction) which is perpendicular to the direction in which the substrate B extends (horizontal direction in FIG. 14).

Various types of light sources are required depending on the kinds of electronic equipment. For instance, instead of the above-described top view type light source, a side view type light source for emitting light in the direction in which the substrate B extends is sometimes required. Since the above-described semiconductor light emitting device X is designed specifically for the use as a top view type light source, the semiconductor light emitting device cannot be mounted on the substrate B as a side view type light source. Thus, when a side view type light source is necessary, a semiconductor light emitting device of a type which is different from the semiconductor light emitting device X needs to be prepared. This causes the manufacturing line to be complicated and also causes the trouble of maintaining various kinds of semiconductor light emitting devices.

SUMMARY OF THE INVENTION

The present invention is proposed under the circumstances described above. It is, therefore, an object of the present invention to provide a semiconductor light emitting device which is capable of being mounted as both of a top view type light source and a side view type light source.

A semiconductor light emitting device provided according to the present invention comprises a semiconductor light emitting element, a lead electrically connected to the semiconductor light emitting element, and a resin package for covering the semiconductor light emitting element and part of the lead, where the resin package includes a lens facing the semiconductor light emitting element. The lead includes an exposed portion extending outside of the resin package, the exposed portion including a first portion and a second portion, where the first portion has a first mount surface oriented in a backward direction along the optical axis of the lens, and the second portion has a second mount surface oriented in a direction perpendicular to the optical axis of the lens.

With this arrangement, by using the first mount surface, the semiconductor light emitting device can be used as a top view type light source. Alternately, by using the second mount surface, the semiconductor light emitting device can be used as a side view type light source.

Preferably, the first portion and the second portion may be connected to each other by a third portion provided with a surface extending perpendicularly to both the first mount surface and the second mount surface. With this arrangement, the first and the second mount surfaces can be connected to each other with desired high rigidity by the third portion. Thus, the first mount surface and the second mount surface are prevented from deviating from the desired position.

Other features and advantages of the present invention will become more apparent from detailed description given below with reference to the accompanying drawings.

BRIEF DESCRIPTION OF THE DRAWINGS

FIG. 5 is a front view showing the semiconductor light emitting device of the first embodiment mounted to serve as a top view type light source.

FIG. 6 is a front view showing the semiconductor light emitting device of the first embodiment mounted to serve as a side view type light source.

FIG. 14 is a sectional view showing an example of conventional semiconductor light emitting device.

DETAILED DESCRIPTION OF THE PREFERRED EMBODIMENTS

Preferred embodiments of the present invention will be described below with reference to the accompanying drawings.

FIGS. 1-4 show a semiconductor light emitting device according to a first embodiment of the present invention. The illustrated semiconductor light emitting device A1 includes a first lead 1A, a second lead 1B, an LED chip 2 and a resin package 3 and is designed as a shell type LED lamp.

Figure 1:
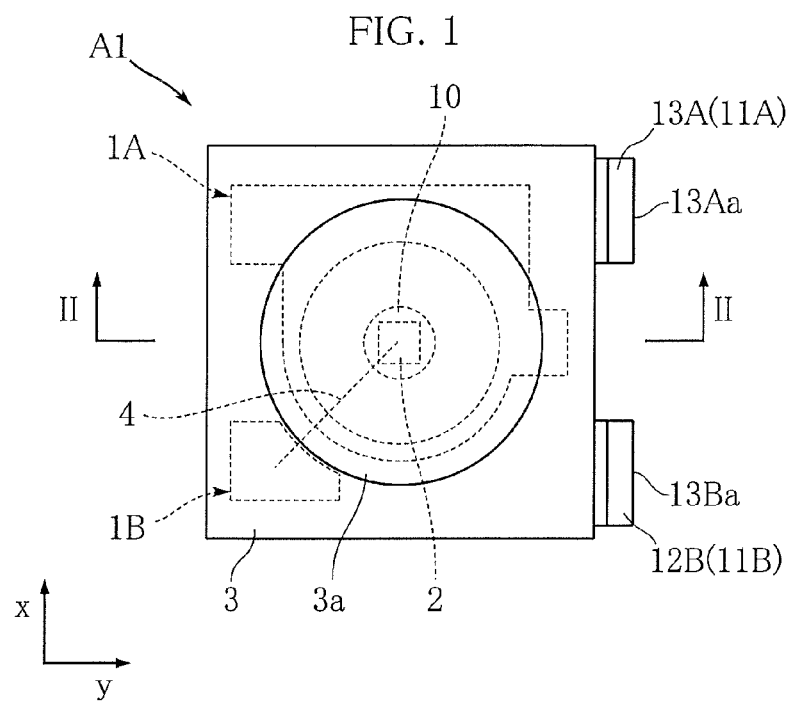
FIG. 1 is a plan view showing a semiconductor light emitting device according to a first embodiment of the present invention.
Figure 2:
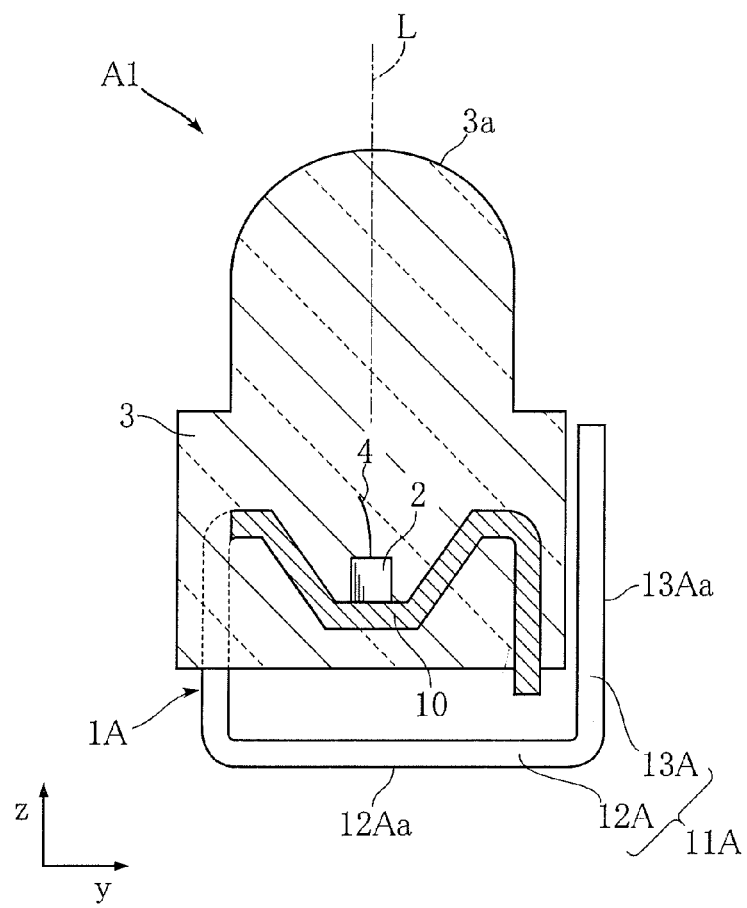
FIG. 2 is a sectional view taken along lines II-II in FIG. 1.

The first lead 1A and the second lead 1B are utilized for mounting the semiconductor light emitting device A1 to a circuit board and supplying power to the LED chip 2 and made of e.g. Cu alloy. Each of the leads 1A and 1B is partially covered by the resin package 3. As shown in FIGS. 1 and 2, the first lead 1A is formed with a bonding cup 10. The bonding cup 10 is shaped like a cone having a flat bottom surface, and the LED chip 2 is mounted on the bottom surface.

Figure 3:
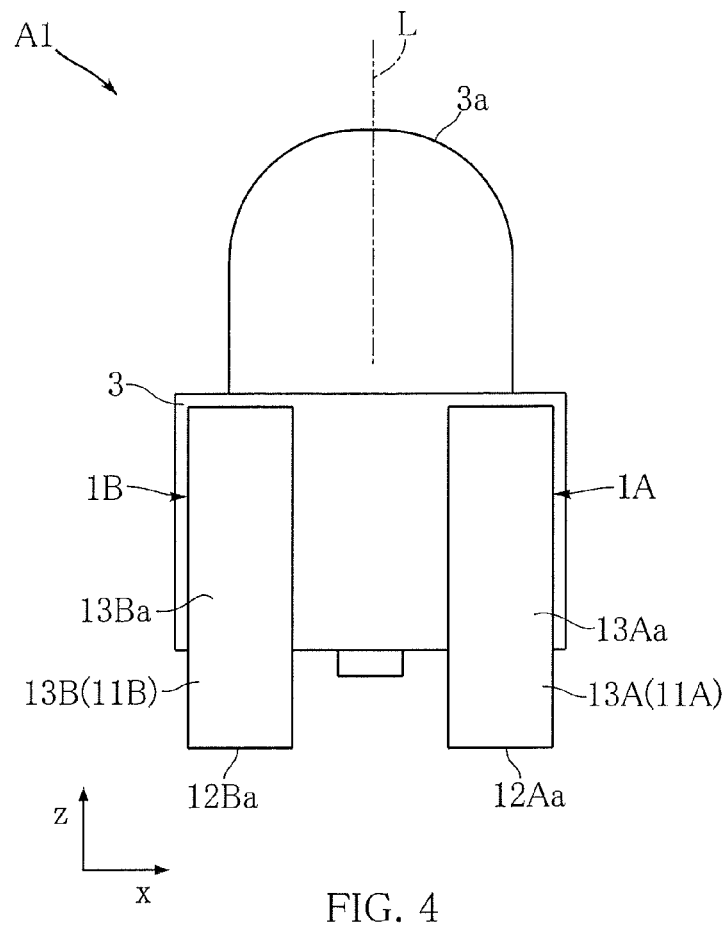
FIG. 3 is a right side view of the semiconductor light emitting device according to the first embodiment.
Figure 4:
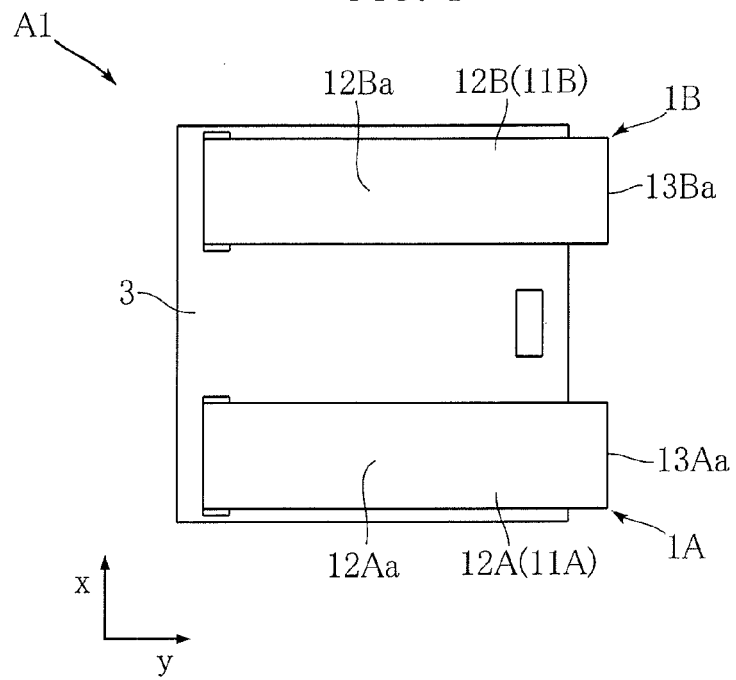
FIG. 4 is a bottom view of the semiconductor light emitting device according to the first embodiment.

The portions of the leads 1A and 1B which project from the resin package 3 provide a first terminal 11A and a second terminal 11B. The first terminal 11A and the second terminal 11B are parallel with each other. The first terminal 11A includes strips 12A and 13A, whereas the second terminal 11B includes strips 12B and 13B. The strips 12A and 12B extend in the direction y generally along the resin package 3. As shown in FIGS. 3 and 4, the surfaces of the strips 12A and 12B which are oriented in the direction z serve as first mount surfaces 12Aa and 12Ba. The strips 13A and 13B are connected perpendicularly to the strips 12A and 12B and extend in the direction z generally along the resin package 3. The surfaces of the strips 13A and 13B which are oriented in the direction y serve as second mount surfaces 13Aa and 13Ba.

The LED chip 2, which is the light source of the semiconductor light emitting device A1, is a semiconductor light emitting element including e.g. an n-type semiconductor layer, a p-type semiconductor layer and an active layer sandwiched between these layers. Due to the recombination of an electron and a hole in the active layer, light having a certain wavelength is generated. The LED chip 2 is bonded to the bottom surface of the bonding cup 10. The upper surface of the LED chip 2 is electrically connected to the second lead 1B via a wire 4. The light emitted from the LED chip 2 in the direction x or y is reflected by the side surface of the bonding cup 10 to travel in the direction z.

The resin package 3 covers the LED chip 2 and part of each lead 1A, 1B. The resin package is made of epoxy resin, silicone resin or other materials capable of transmitting light emitted from the LED chip 2. The resin package 3 is formed with a lens 3a. The lens 3a faces the LED chip 2 and has an optical axis L extending in the direction z. The lens 3a enhances the directivity of the light emitted from the LED chip 2.

The semiconductor light emitting device A1 can be made as follows.

First, a lead frame for forming the first lead 1A and the second lead 1B is prepared. The lead frame is subjected to a drawing process, and then part of the lead frame is bent to form the bonding cup 10 and the portion for bonding the wire 4.

Then, the LED chip 2 is bonded to the bonding cup 10. Thereafter, an end of the wire 4 is bonded to the LED chip 2, while the other end of the wire is bonded to the second lead 1B. A resin material in liquid state to form the resin package 3 is supplied into a mold which is open upward. The LED chip 2, the wire 4 and part of each lead 1A, 1B are immersed in the resin material. In this state, the resin material is hardened, whereby the resin package 3 is formed. Then, portions of the leads 1A and 1B which project from the resin package 3 are bent to form terminals 11A and 11B.

The advantages of the semiconductor light emitting device A1 will be described below.

The semiconductor light emitting device A1 according to the first embodiment can be mounted as both of a top view type light source and a side view type light source. FIG. 5 shows the semiconductor light emitting device A1 mounted on a substrate B to serve as a top view type light source. In this case, the semiconductor light emitting device A1 is surface-mounted using solder S, with the first mount surfaces 12Aa and 12Ba facing the substrate B. In this state, the optical axis L extends perpendicularly to the direction in which the substrate B extends. FIG. 6 shows the semiconductor light emitting device A1 mounted on a substrate B to serve as a side view type light source. In this case, the semiconductor light emitting device A1 is surface-mounted using solder S, with the second mount surfaces 13Aa and 13Ba facing the substrate B. In this state, the optical axis L extends in the direction in which the substrate B extends.

As described above, the semiconductor light emitting device A1 can be used as both types of light sources, i.e., a top view type light source and a side view type light source. Thus, it is not necessary to prepare two kinds of semiconductor light emitting devices designed specifically as each type of light source. Thus, the manufacturing line does not become complicated, and the maintenance of the semiconductor light emitting devices is facilitated.

FIGS. 7-13 show other embodiments of the present invention. In these figures, the elements which are identical or similar to those of the first embodiment are designated by the same reference sign as those used for the first embodiment.

Figure 7:
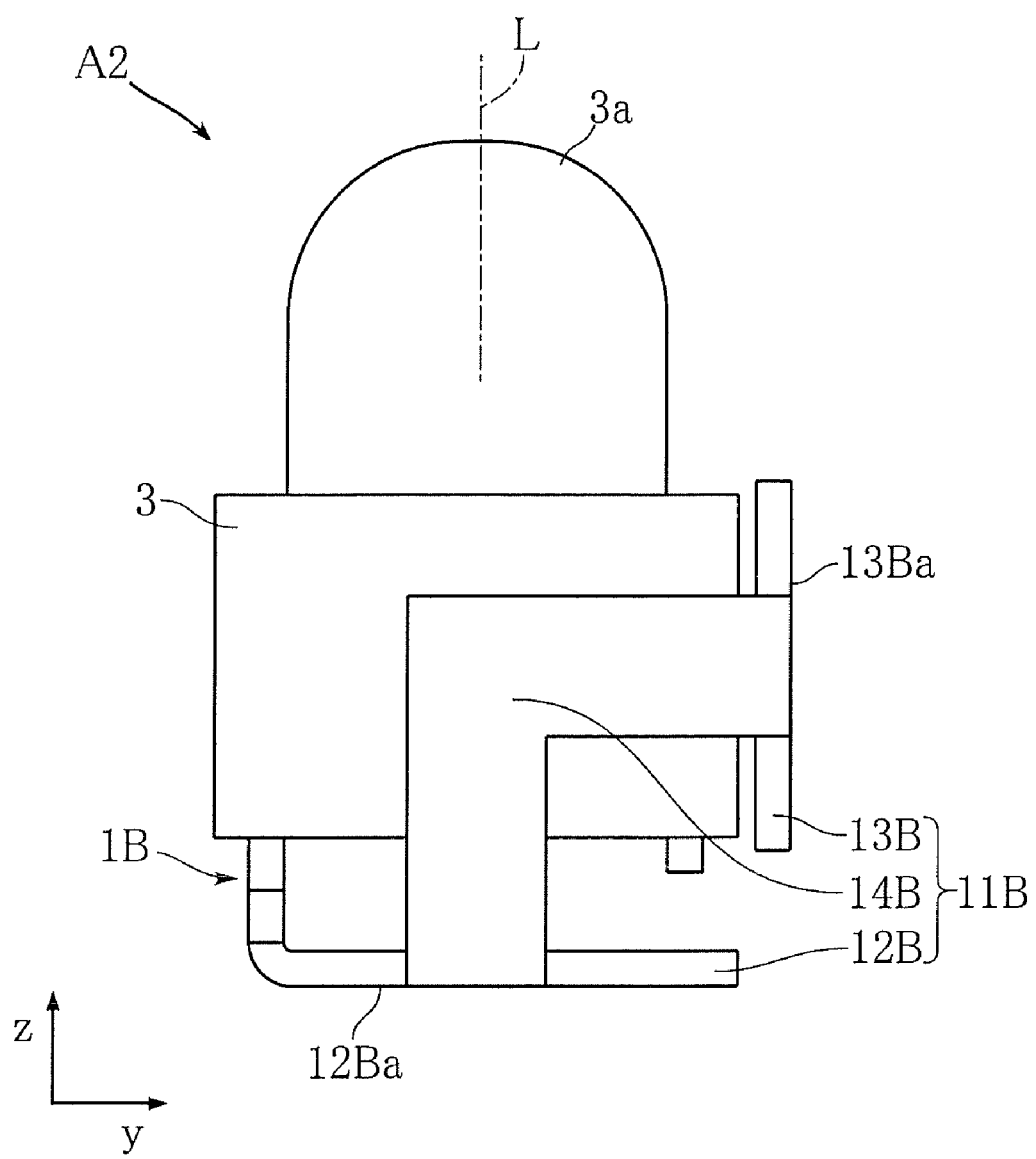
FIG. 7 is a front view showing a semiconductor light emitting device according to a second embodiment of the present invention.
Figure 8:
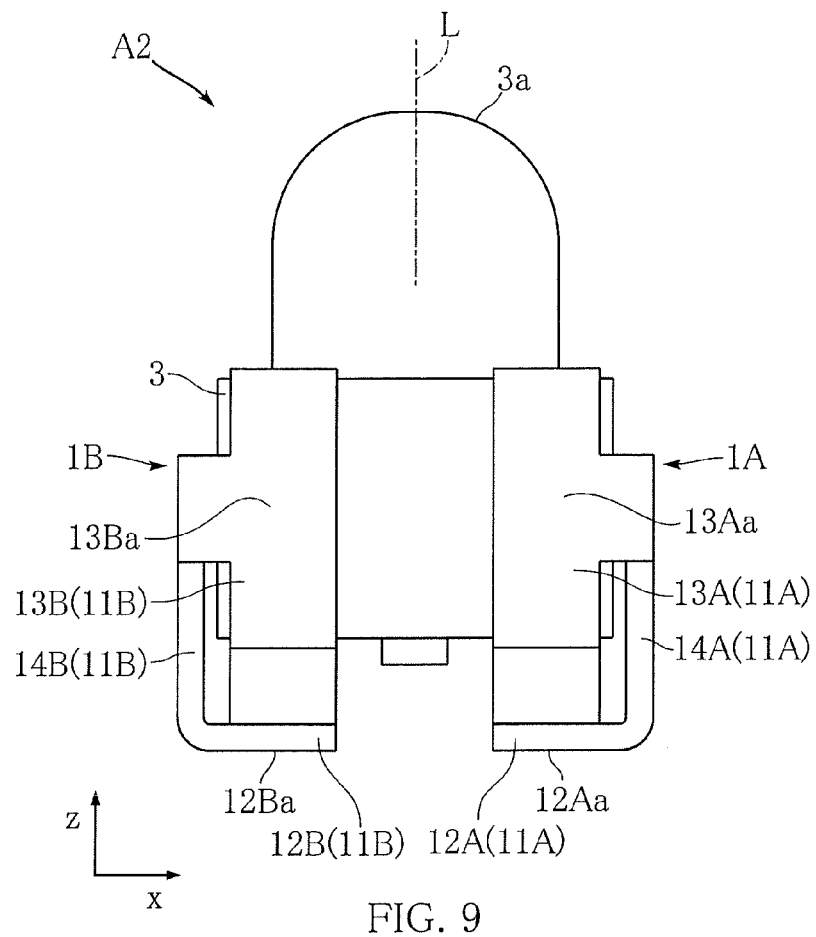
FIG. 8 is a right side view of the semiconductor light emitting device according to the second embodiment.
Figure 9:
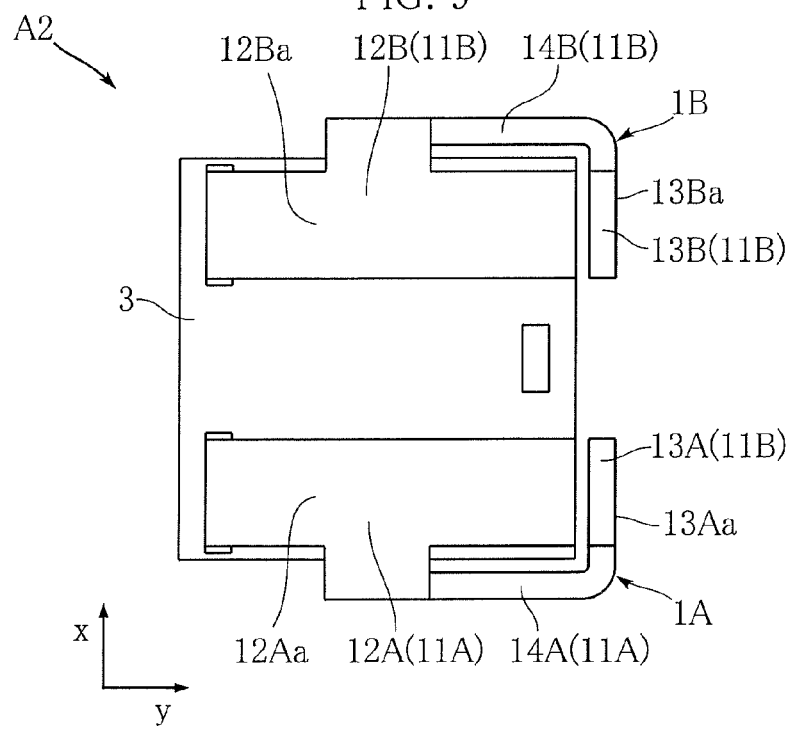
FIG. 9 is a bottom view of the semiconductor light emitting device according to the second embodiment.
Figure 10:
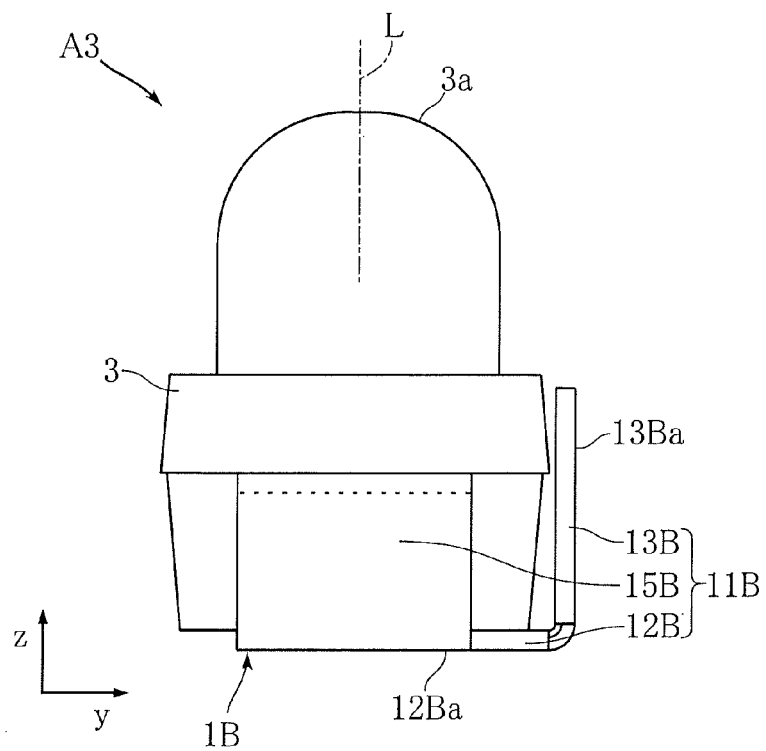
FIG. 10 is a front view showing a semiconductor light emitting device according to a third embodiment of the present invention.
Figure 11:
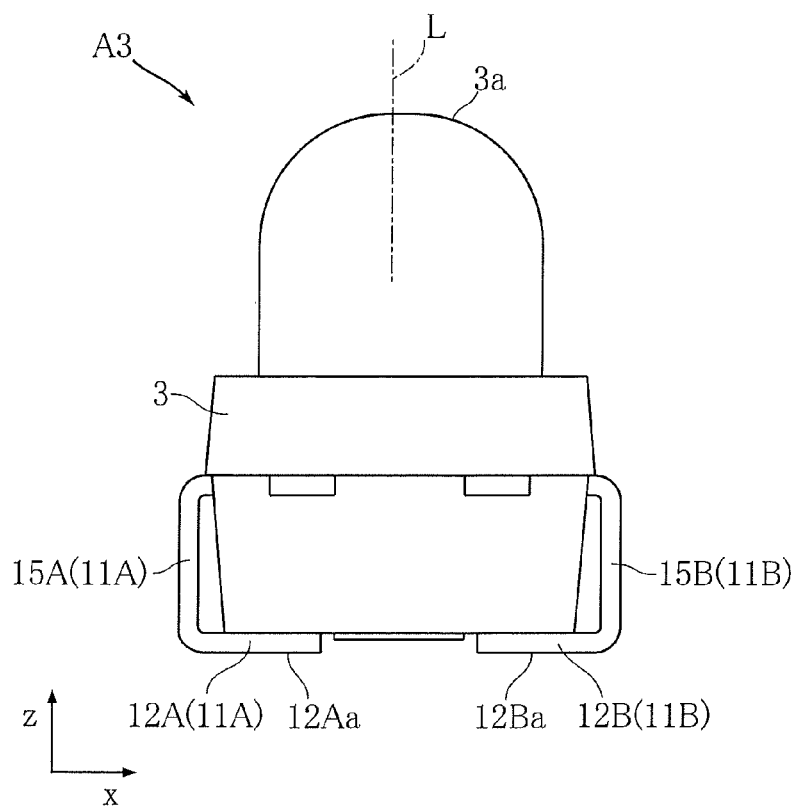
FIG. 11 is a left side view of the semiconductor light emitting device according to the third embodiment.
Figure 12:
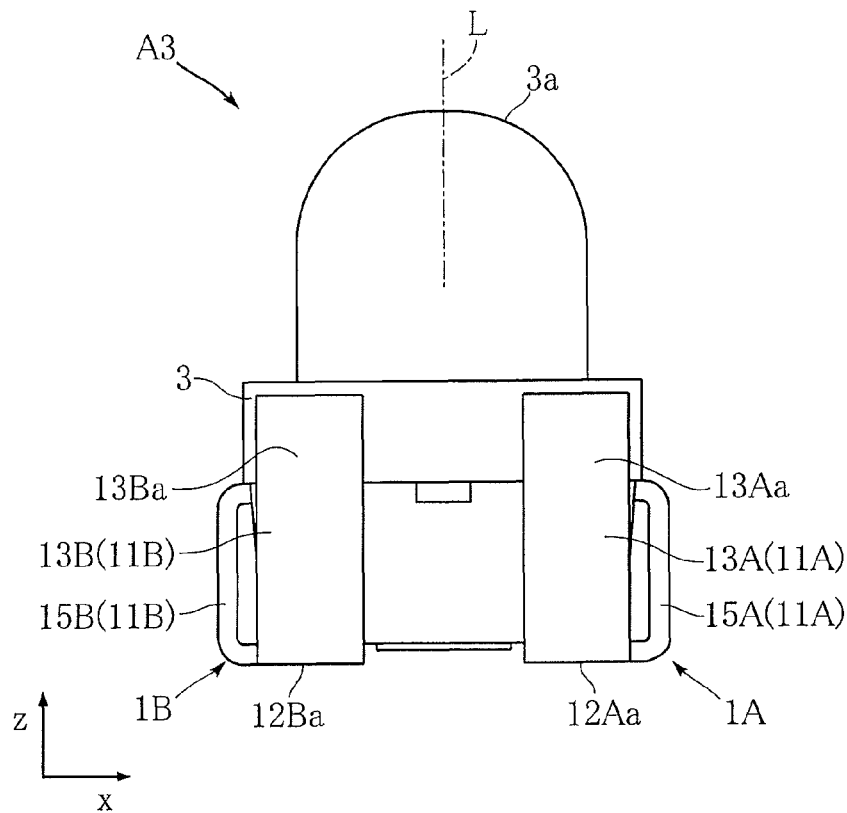
FIG. 12 is a right side view of the semiconductor light emitting device according to the third embodiment.

FIGS. 7-9 show a semiconductor light emitting device according to a second embodiment of the present invention. The illustrated semiconductor light emitting device A2 differs from that of the first embodiment in structure of the first terminal 11A and the second terminal 11B. Specifically, in the second embodiment, the first terminal 11A and the second terminal 11B includes a first connection portion 14A and a second connection portion 14B, respectively. Each of the connection portions 14A and 14B is in the form of a hook including a straight portion extending in the direction z and a straight portion extending in the direction y and forms a flat surface oriented in the direction x. The first connection portion 14A connects the strip 12A and the strip 13A to each other. The second connection portion 14B connects the strip 12B and the strip 13B to each other.

The semiconductor light emitting device A2 having the above-described structure can be mounted on a substrate B (see FIGS. 5 and 6) either way as a top view type light source or a side view type light source. In addition, it is possible to prevent the second mount surfaces 13Aa and 13Ba from unduly inclining with respect to the resin package 3. This advantage is obtained due to the great flexural rigidity of the first and second connection portions 14A, 14B about the x axis. Thus, the angle between the strip 12A, 12B and the strip 13A, 13B can remain substantially the same. Accordingly, the semiconductor light emitting device A2 can be used properly as a top view type light source or a side view type light source, while the optical axis L is kept to extend in the required direction.

FIGS. 10-13 show a semiconductor light emitting device according to a third embodiment of the present invention. In the illustrated semiconductor light emitting device A3, the technique employed to form the resin package 3 is different from those employed for the foregoing embodiments, and also the configuration of the first terminal 11A and the second terminal 11B is different from that of the counterparts in the foregoing embodiments.

Figure 13:
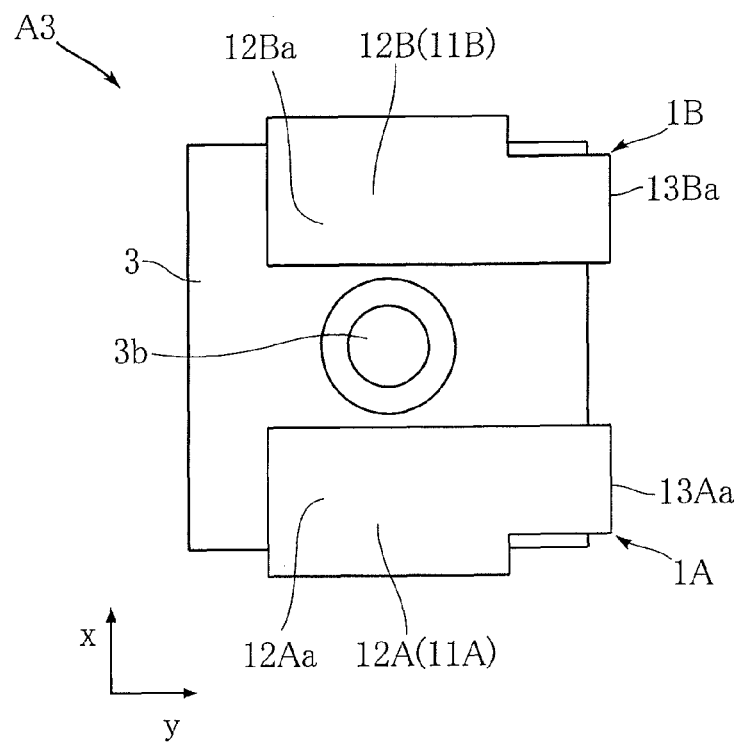
FIG. 13 is a bottom view of the semiconductor light emitting device according to the third embodiment.

In the third embodiment, the resin package 3 is formed by e.g. transfer molding. As shown in FIG. 13, in separating the resin package 3 from the mold, the trace 3b of an ejector pin is formed in the resin package. The first terminal 11A and the second terminal 11B project from the resin package 3 in the direction x. The first terminal 11A and the second terminal 11B include a first detouring portion 15A and a second detouring portion 15B, respectively. The detouring portions 15A and 15B are suspended vertically in the direction z toward the bottom surface of the resin package 3. The first detouring portion 15A has an end to which the strip 12A extending horizontally and the strip 13A extending vertically are connected in the mentioned order. Similarly, the second detouring portion 15B has an end to which the strip 12B extending horizontally and the strip 13B extending vertically are connected in the mentioned order. The semiconductor light emitting device A3 according to the third embodiment can also be used as either one of a top view type light source and a side view type light source.

The invention claimed is:

1. A semiconductor light emitting device comprising:
a semiconductor light emitting element;
a lead electrically connected to the semiconductor light emitting element; and
a resin package covering the semiconductor light emitting element and part of the lead, the resin package including a lens facing the semiconductor light emitting element;
wherein the lead includes an exposed portion extending outside of the resin package, the exposed portion comprising a first mount surface and a second mount surface, the first mount surface having a normal line parallel to an optical axis of the lens and being disposed behind the resin package in a direction along the optical axis of the lens, the second mount surface having a normal line perpendicular to the optical axis of the lens and being spaced further from the optical axis of the lens than the resin package is,
wherein the first mount surface and the second mount surface are connected to each other via a strip portion.

2. The semiconductor light emitting device according to claim 1, wherein the exposed portion of the lead includes a surface perpendicular to both the first mount surface and the second mount surface.

3. The semiconductor light emitting device according to claim 1, wherein the resin package is of a shell type.

4. The semiconductor light emitting device according to claim 1, wherein the lead is made of Cu alloy.

5. The semiconductor light emitting device according to claim 1, wherein the lead comprises a first lead and a second lead that include a first terminal and a second terminal, respectively, exposed from the resin package, and the first terminal and the second terminal protrude in parallel to each other from the resin package.

6. The semiconductor light emitting device according to claim 1, wherein the resin package is made of epoxy resin or silicone resin.

7. The semiconductor light emitting device according to claim 1, wherein the resin package is formed by transfer molding and formed with a trace of an ejector pin.

8. The semiconductor light emitting device according to claim 1, wherein the lead is provided with a bonding cup.

9. The semiconductor light emitting device according to claim 8, wherein the bonding cup is formed integrally with the lead by a drawing process.

10. The semiconductor light emitting device according to claim 8, wherein the bonding cup is a frustoconical form.

11. The semiconductor light emitting device according to claim 10, wherein the light emitting element is mounted on a bottom surface defined by the frustoconical form.

12. The semiconductor light emitting device according to claim 1, wherein the lead comprises a first lead and a second lead that include a first terminal and a second terminal, respectively, exposed from the resin package, and each of the first terminal and the second terminal includes a first strip and a second strip.

13. The semiconductor light emitting device according to claim 12, wherein each of the first lead and the second lead comprises a bypassing portion disposed between the resin package and the first strip.

14. The semiconductor light emitting device according to claim 13, wherein the bypassing portion of the first lead is in the first terminal, so that the first terminal extends from the resin package to the first strip and the second strip via the bypassing portion of the first lead, and the bypassing portion of the second lead is in the second terminal, so that the second terminal extends from the resin package to the first strip and the second strip via the bypassing portion of the second lead.

15. The semiconductor light emitting device according to claim 12, wherein the first strip provides the first mount surface, and the second strip provides the second mount surface.

16. The semiconductor light emitting device according to claim 15, wherein the first strip and the second strip are perpendicularly connected to each other.

17. The semiconductor light emitting device according to claim 15, further comprising a connection portion for connecting the first strip and the second strip to each other.

18. The semiconductor light emitting device according to claim 17, wherein the connection portion is perpendicular to both the first strip and the second strip.

19. The semiconductor light emitting device according to claim 17, wherein the connection portion has a right-angled hook shape.

20. A mounting structure comprising:
a semiconductor light emitting device according to claim 15; and
a support board;
wherein the first mount surface is fixed to the support board by solder.

21. A mounting structure comprising:
a semiconductor light emitting device according to claim 15; and
a support board;
wherein the second mount surface is fixed to the support board by solder.

* * * * *